(12) United States Patent
Ohtsuki et al.

(10) Patent No.: US 6,982,914 B2
(45) Date of Patent: Jan. 3, 2006

(54) SEMICONDUCTOR MEMORY DEVICE

(75) Inventors: Hirohisa Ohtsuki, Ashiya (JP); Toshikazu Suzuki, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/754,747

(22) Filed: Jan. 8, 2004

(65) Prior Publication Data

US 2004/0141395 A1    Jul. 22, 2004

(30) Foreign Application Priority Data

Jan. 16, 2003 (JP) ............................. 2003-008791

(51) Int. Cl.
*G11C 7/02* (2006.01)
(52) U.S. Cl. ...................................... 365/210; 365/191
(58) Field of Classification Search ................ 365/210, 365/191
See application file for complete search history.

(56) References Cited

U.S. PATENT DOCUMENTS

| 5,268,869 | A | 12/1993 | Ferris et al. |
| 6,172,925 | B1 | 1/2001 | Bloker |
| 6,490,214 | B2 | 12/2002 | Kawasumi |
| 6,556,472 | B2 | 4/2003 | Yokozeki |
| 6,603,687 | B2 * | 8/2003 | Jun et al. ............ 365/194 |

* cited by examiner

*Primary Examiner*—Richard Elms
*Assistant Examiner*—Pho M. Luu
(74) *Attorney, Agent, or Firm*—Hamre, Schumann, Mueller & Larson, P.C.

(57) ABSTRACT

A semiconductor memory device includes a replica circuit including a plurality of replica cells (RMC) having the same elements as those of memory cells in a memory array and outputting signals with levels in the stage number to a common replica bit line, and a sense amplifier control circuit for receiving a signal of the replica bit line to control a timing of a signal SAE for starting a sense amplifier circuit. The replica circuit includes a switching circuit (SW) for switching the stage number of the replica cells to be activated among the plurality of replica cells in a programmable manner.

14 Claims, 14 Drawing Sheets

SEMICONDUCTOR MEMORY DEVICE

BACKGROUND OF THE INVENTION

1. Field of the Invention

The present invention relates to a semiconductor memory device generating a start timing signal of a sense amplifier circuit, using a replica circuit including replica cells having the same configuration as that of memory cells included in a memory array.

2. Description of the Related Art

There are a number of methods for generating a timing signal of a sense amplifier for amplifying data read from memory cells and allowing a read timing of the memory cells to follow the variation due to a process, a voltage, or the like in a conventional semiconductor memory device. Among them, there is a method for varying a timing signal in a programmable manner, using a replica circuit. Hereinafter, this method will be described.

FIG. 11 is a functional block diagram (see U.S. Pat. No. 6,172,925) showing an exemplary configuration of a conventional semiconductor memory device. In FIG. 11, the conventional semiconductor memory device includes an SRAM memory array (hereinafter, merely referred to as a "memory array") 900, a row decoder 901 connected to the memory array 900, a replica control circuit 902, sense amplifier circuits 903 connected to the memory array 900 and the row decoder 901, a replica circuit 904 controlled by the replica control circuit 902, and a sense amplifier control circuit 905 for controlling the sense amplifier circuits 903, connected to the replica circuit 904. Reference numeral 906 denotes SRAM memory cells (hereinafter, merely referred to as "memory cells") constituting the memory array 900.

As shown in FIG. 11, the memory cells 906 are connected to word lines WL0 to WLx that are output signal lines of the row decoder 901 in a row direction, and connected to common bit lines BL, BB in a column direction.

FIG. 12 is a circuit diagram showing an internal configuration of the memory cell 906 shown in FIG. 11. In FIG. 12, the memory cell 906 includes an N-type transistor NA1 having a gate connected to a word line WL and a source connected to a bit line BL, an N-type transistor NA2 having a gate connected to the word line WL and a source connected to a bit line BB, a P-type transistor PL1 having a source supplied with a supply voltage VDD and a drain connected to a drain of the N-type transistor NA1, an N-type transistor ND1 having a gate connected to a gate of the P-type transistor PL1, a drain connected to the drain of the P-type transistor PL1, and a source connected to a ground potential VSS, a P-type transistor PL2 having a gate connected to the drain of the N-type transistor NA1, a source supplied with the supply voltage VDD, and a drain connected to a drain of the N-type transistor NA2, and an N-type transistor ND2 having a gate connected to the gate of the P-type transistor PL2, a drain connected to the drain of the P-type transistor PL2, and a source connected to a ground potential VSS.

Herein, the P-type transistor PL1 and the N-type transistor ND1 constitute a first inverter. The p-type transistor PL2 and the N-type transistor ND2 constitute a second inverter. An input terminal and an output terminal of the first inverter are connected respectively to an output terminal and an input terminal of the second inverter, whereby a latch circuit is configured.

FIG. 13 is a block diagram showing an internal configuration and a connection relationship of the replica circuit 904 shown in FIG. 11. In FIG. 13, reference numeral 907 denotes a replica word line (RWL) for driving the replica circuit 904, 908 denotes a replica bit line (RBL) connected to replica cells 909, 909 denotes replica cells (RMC), 910 denotes a selection line (SL1) for selecting one replica cell 909, 911 denotes a selection line (SL2) for selecting two replica cells 909, and 912 denotes a selection line (SL4) for selecting four replica cells 909.

As shown in FIG. 13, the word lines WL of the replica cells 909 are commonly connected to the replica word line 907 for driving the replica cells 909. One bit line BL of each replica cell 909 is connected to the selection line 910, 911, or 912 for selecting the replica cells 909. The other bit line BB of each replica cell 909 is connected to the replica bit line 908.

FIG. 14 is a circuit diagram showing an internal configuration of the replica cell 909 shown in FIG. 13. In FIG. 14, the transistors constituting the replica cell 909 have the same size as that of the transistors constituting the memory cell 906 shown in FIG. 12. In the latch circuit included in the replica cell 909, the first inverter composed of the P-type transistor PL1 and the N-type transistor ND1 is electrically insulated, and the second inverter composed of the P-type transistor PL2 and the N-type transistor ND2 has its output level fixed to a High level.

Next, an operation of a conventional semiconductor memory device configured as described above will be described. First, one of the word lines WL0 to WLx that are output signal lines of the row decoder 901 is selected, and data of the memory cells 906 are read to the bit lines BL, BB. The bit lines BL, BB and the replica bit line RBL are previously charged to a High level, and floated during selection of the word lines WL0 to WLx. There are a plurality of bit lines BL, BB, and a plurality of data are respectively read to the bit lines BL, BB.

The replica word line RWL that is an output signal line of the replica control circuit 902 is driven at substantially the same timing as that for selecting the word lines WL0 to WLx. Among n replica cells 909, transistors of the replica cells 909 selected by the selection lines 910 to 912 shift the signal level of the replica bit line RBL from a High level to a Low level at a speed that is n times that of the memory cells 906. The sense amplifier control circuit 905 detects the signal level of the replica bit line RBL, and generates a sense amplifier starting signal SAE. The sense amplifier starting signal SAE is input to the sense amplifier circuits 903, whereby the data of the bit lines BL, BB are amplified.

For example, it is assumed that the supply voltage VDD is 1.2 V, and it is desired to start the sense amplifier circuit 903 when a potential difference of data read from the memory cells 906 to the bit lines BL, BB is 100 mV In this case, if the number n of the replica cells 909 to be selected is set to be 6, the signal level of the replica bit line RBL is shifted to 600 mV (i.e., a half-value of the supply voltage VDD) at a desired sense amplifier start timing, and thus, the sense amplifier starting signal SAE can be generated by a simple CMOS gate without using a complicated potential detection circuit.

However, with the above-mentioned configuration of a semiconductor memory device, there are the following problems.

First, as the number of options regarding a start timing of the sense amplifier circuit 903 is increased, more replica cells 909 need to be provided. Furthermore, a new wiring region should be reserved even with respect to selection lines for selecting the replica cells 909. Consequently, a layout area is increased.

SUMMARY OF THE INVENTION

Therefore, with the foregoing in mind, it is an object of the present invention to provide a semiconductor memory device capable of supplying an optimum start timing to a sense amplifier circuit without increasing a layout area, by varying the stage number of replica cells in a programmable manner.

In order to achieve the above-mentioned object, a semiconductor memory device of the present invention includes a memory array including a plurality of memory cells, a sense amplifier circuit for amplifying data read from selected memory cells in the memory array to bit lines, a replica circuit including a plurality of replica cells having the same elements as those of the memory cells that outputs a signal at a level in accordance with a stage number to a common replica bit line, and a sense amplifier control circuit for receiving the signal of the replica bit line to control a timing of a signal (SAE) for starting the sense amplifier circuit. The replica circuit includes a switching circuit for switching the stage number of replica cells to be activated among the plurality of replica cells.

In the semiconductor memory device of the present invention, it is preferable that the switching circuit switches a connection state of a power line to the plurality of replica cells, thereby switching the stage number of replica cells to be activated.

Alternatively, in the semiconductor memory device of the present invention, it is preferable that the replica circuit includes a plurality of switching circuits on one power line.

Alternatively, in the semiconductor memory device of the present invention, it is preferable that the replica circuit includes switching circuits on a plurality of power lines.

Furthermore, in the semiconductor memory device of the present invention, it is preferable that the replica circuit includes dummy cells having the same layout as that of the replica cells and disposed between the switching circuit and the replica cells.

In this case, it is preferable that the switching circuit is configured using transistors constituting the dummy cells, and it is more preferable that the switching circuit is configured by connecting the transistors constituting the dummy cells in parallel to each other.

Alternatively, it is preferable that the switching circuit is configured using transistors in a region of edge cells adjacent to a region of the dummy cells, and it is more preferable that the switching circuit is configured by connecting transistors in a region of the dummy cells in parallel with transistors in a region of the edge cells adjacent to the region of the dummy cells.

In the semiconductor memory device of the present invention, it is preferable that a switching control line of the switching circuit is formed using a layout of power lines or bit lines of the adjacent edge cells.

Furthermore, it is preferable that the semiconductor memory device of the present invention includes a selection circuit for supplying a control signal to the switching circuit via a switching control line, and the selection circuit includes a storage unit for holding a level of the control signal. In this case, it is preferable that the storage unit is a non-volatile memory unit including a fuse element capable of being disconnected by a laser.

Alternatively, the semiconductor memory device of the present invention includes a control circuit for supplying a control signal with a level varied between a read operation and a write operation to the switching circuit via a switching control line.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of preferred embodiments with reference to the drawings.

Embodiment 1

Figure 1:
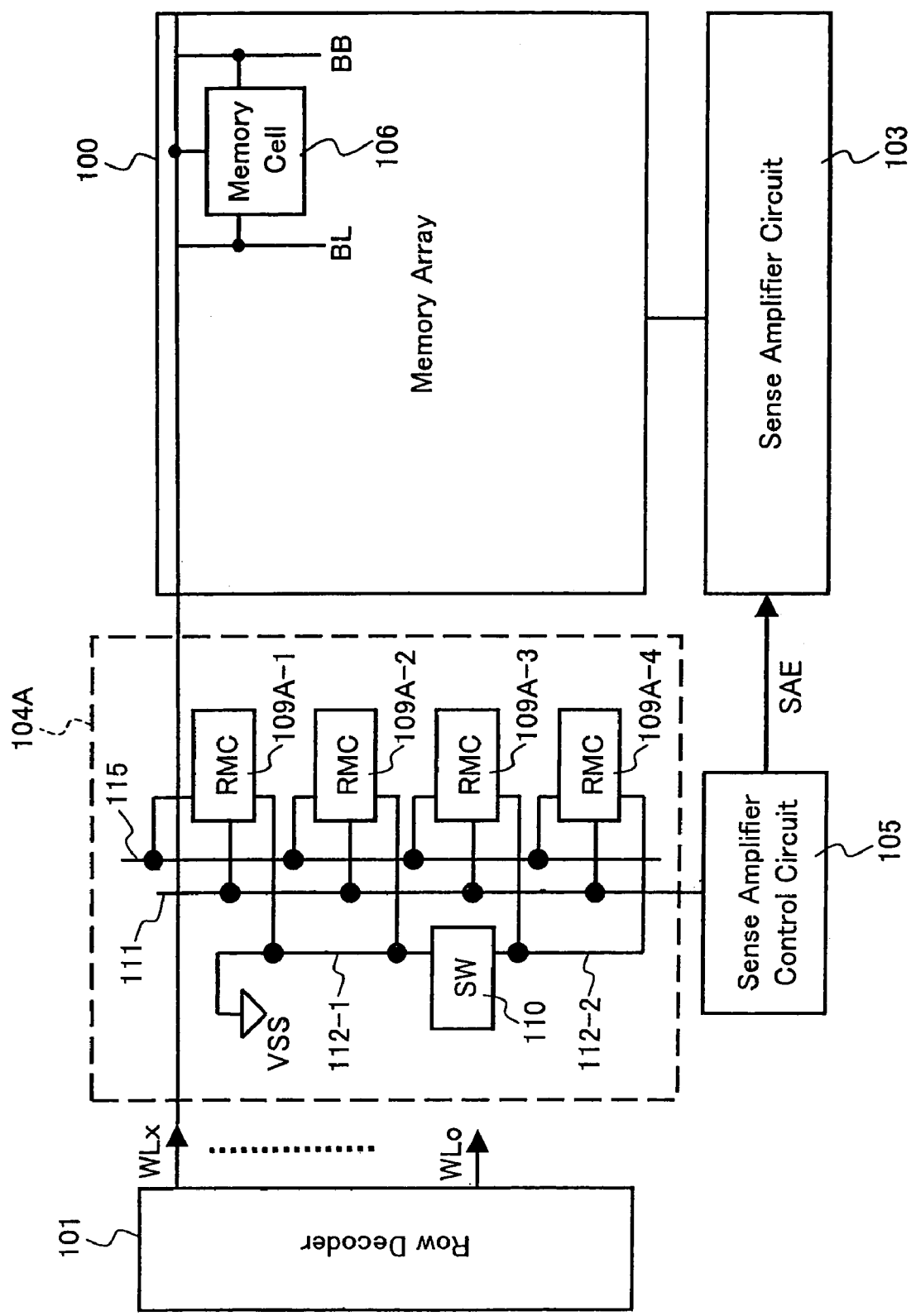
FIG. 1 is a functional block diagram showing an exemplary configuration of a semiconductor memory device according to Embodiment 1 of the present invention.

FIG. 1 is a functional block diagram showing an exemplary configuration of a semiconductor memory device according to Embodiment 1 of the present invention. In FIG. 1, the semiconductor memory device of the present embodiment includes a memory array 100 including a plurality of memory cells 106, a row decoder 101 connected to the memory array 100, a sense amplifier circuit 103 for amplifying data read from selected memory cells 106 to bit lines BL, BB, a replica circuit 104A, and a sense amplifier control circuit 105 for supplying a sense amplifier starting signal SAE to the sense amplifier circuit 103.

The replica circuit 104A includes a plurality of replica cells 109A-1, 109A-2, 109A-3, and 109A-4 (hereinafter, which may be referred to collectively as 109A) having the same elements as those of the memory cells 106, driven via a dummy bit line 115, and outputting signals with levels corresponding to the stage number to a common replica bit line (RBL) 111, and a switching circuit (SW) 110 for switching the stage number of replica cells to be activated between two stages replica cells 109A-1, 109A-2) and four stages (replica cells 109A-1, 109A-2, 109A-3, 109A-4), by switching a power line 112-1 connected to a ground potential VSS and a power line 112-2 connected to the ground potential VSS to a connected state or a disconnected state. The internal configuration of the replica cell 109A will be described later with reference to FIG. 3A.

Next, an operation of a semiconductor memory device configured as described above will be described.

When the memory array 100 is accessed from outside, one of the word lines WL0 to WLx that are output signal lines of the row decoder 101 is selected, and data of the memory cells 106 are read to the bit lines BL, BB. The bit lines BL, BB, and the replica bit line 111 are previously charged to a High level by a bit line precharging circuit (not shown), and floated during selection of the word lines WL0 to WLx. There are a plurality of bit lines BL, BB. A plurality of data are respectively read to the bit lines BL, BB, and amplified by the sense amplifier circuit 103.

At substantially the same timing as that for selecting the word lines WL0 to WLx, the dummy bit line 115 is driven and a plurality of replica cells 109A are selected. The transistors constituting the plurality of replica cells 109 shift the signal level of the replica bit line 111 from a High level to a Low level at a speed that is n (n represents the stage number of the replica cells 109A to be selected by the switching circuit 110) times that of the memory cells 106, and sends the signal to the sense amplifier control circuit 105. When the signal of the replica bit line 111 reaches a predetermined level in accordance with the stage number of the selected replica cells 109A, the sense amplifier control circuit 105 activates a sense amplifier starting signal SAE. The sense amplifier circuit 103 amplifies the data on the bit lines BL, BB based on an activation timing of the sense amplifier starting signal SAE.

The stage number n of the replica cells 109A to be selected is determined by the switching circuit 110. When the switching circuit 110 is in an OFF state, only the replica cells 109A-1 and 109A-2 connected to the ground potential VSS via the power line 112 are selected. At this time, the replica cells 109A-3 and 109A-4 that are not selected by the switching circuit 110 cannot allow a current to flow through the power line 112, so that they are not operated as replica cells. When the switching circuit 110 is turned on, the replica cells 109A-3 and 109A-4, which have not been operated, also are activated to be operated.

As described above, according to the present embodiment, the stage number of the replica cells 109A to be activated can be varied in a programmable manner by only using the switching control of the switching circuit 110. Thus, the practical effect is remarkable.

Embodiment 2

Figure 2:
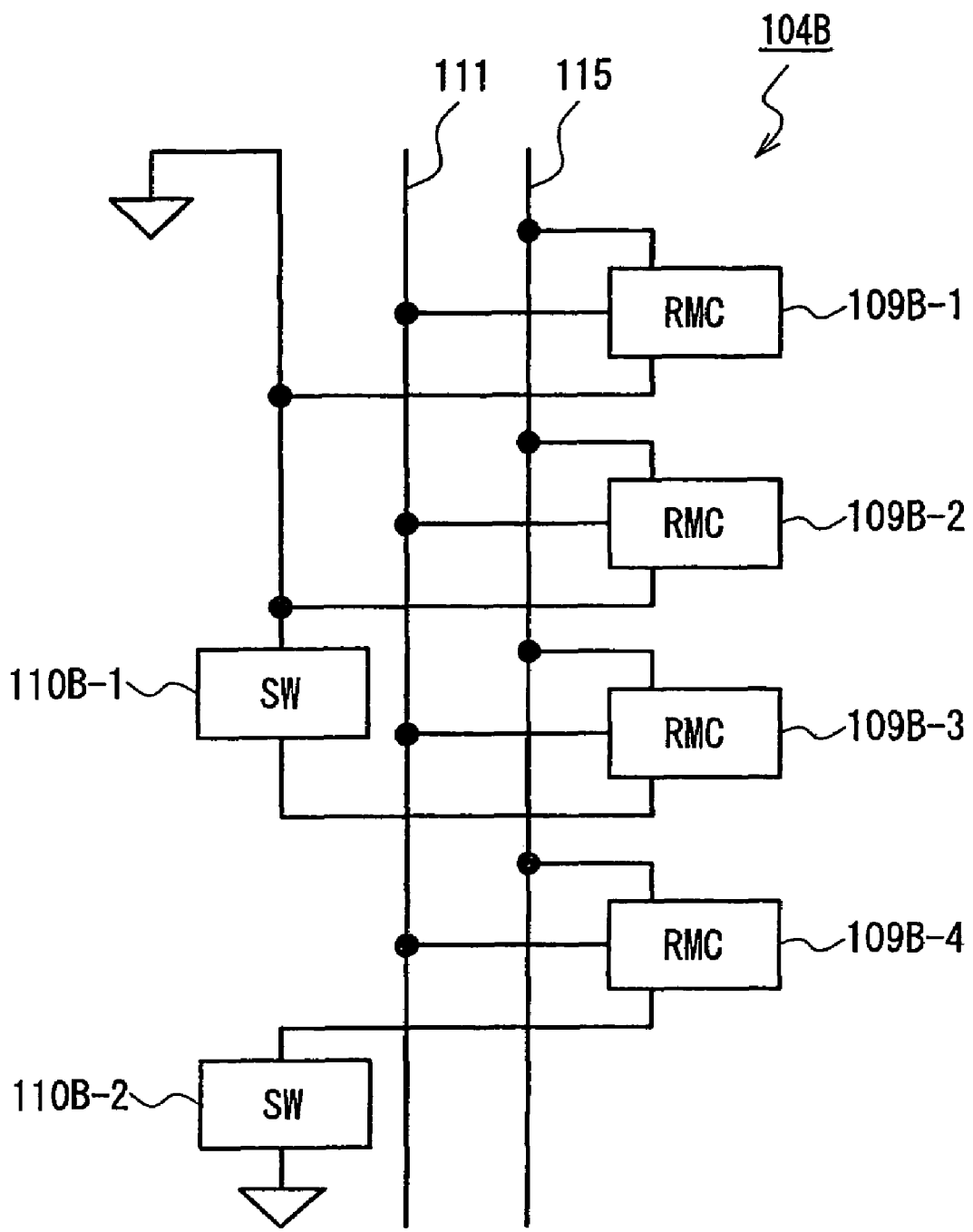
FIG. 2 is a functional block diagram showing an exemplary configuration of a replica circuit 104B in a semiconductor memory device according to Embodiment 2 of the present invention.

FIG. 2 is a functional block diagram showing an exemplary configuration of a replica circuit in a semiconductor memory device according to Embodiment 2 of the present invention. In FIG. 2, the replica circuit 104B in the present embodiment includes replica cells 109B-1, 109B-2, 109B-3, and 109B-4 (hereinafter, which may be referred to collectively as 109B), and switching circuits 110B-1 and 110B-2 (hereinafter, which may be referred to collectively as 110B).

When the replica cells are selected in the same way as in Embodiment 1, a current may be limited by passing through the switching circuits, resulting in less current than originally expected. In order to avoid this, the switching circuits 110B-1 and 110B-2 are provided respectively on different power lines. Because of this, a current will not be limited by passing through the switching circuits 110B.

As described above, according to the present embodiment, by providing the switching circuits 110B on a plurality of power lines, even when the stage number of the replica cells is increased, a replica circuit can be configured so as to follow a change in a voltage and a process. Thus, the practical effect is remarkable.

Embodiment 3

Figure 3:
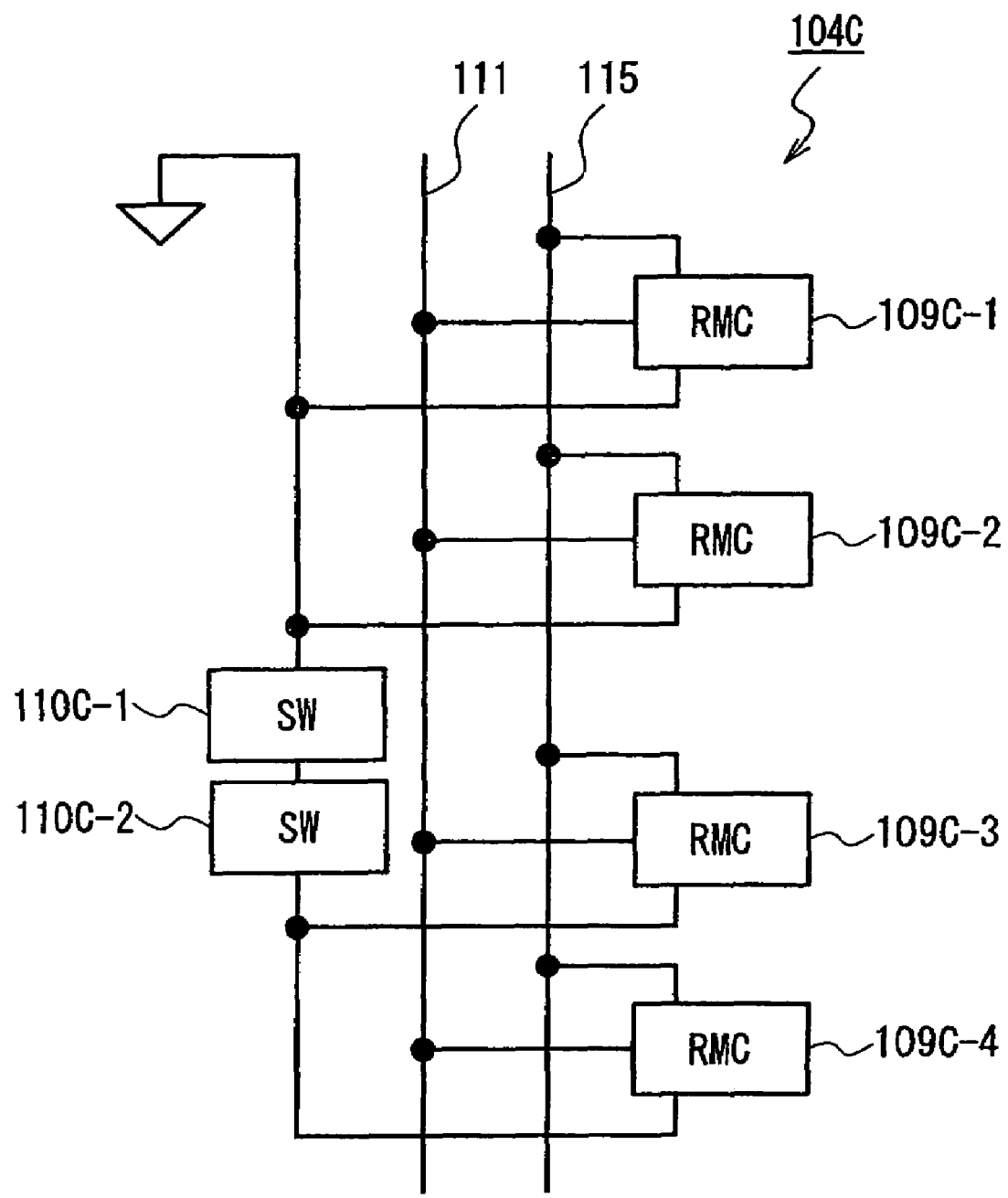
FIG. 3 is a functional block diagram showing an exemplary configuration of a replica circuit 104C in a semiconductor memory device according to Embodiment 3 of the present invention.

FIG. 3 is a functional block diagram showing an exemplary configuration of a replica circuit in a semiconductor memory device according to Embodiment 3 of the present invention. In FIG. 3, a replica circuit 104C in the present embodiment includes replica cells 109C-1, 109C-2, 109C-3, and 109C-4 (hereinafter, which may be referred to collectively as 109C), and switching circuits 110C-1 and 110C-2 (hereinafter, which may be referred to collectively as 110C).

In order to optimize the start timing of a sense amplifier by pulling out the replica bit line 111 to an intended potential, fine adjustment is required. Furthermore, when replica cells are selected in the same way as in Embodiment 1, a current may be limited by passing through the switching circuits, resulting in less current than originally expected. In order to avoid this, by providing a plurality of switching circuits 110C-1 and 110C-2 on one power line, the current amount to be pulled out from a bit line is limited, whereby the replica bit line 111 can be pulled out to a desired potential.

As described above, according to the present embodiment, by providing a plurality of switching circuits 110C on a power line, the replica bit line 111 can be pulled out to a desired potential. Thus, the practical effect is remarkable.

Embodiment 4

Figure 4:
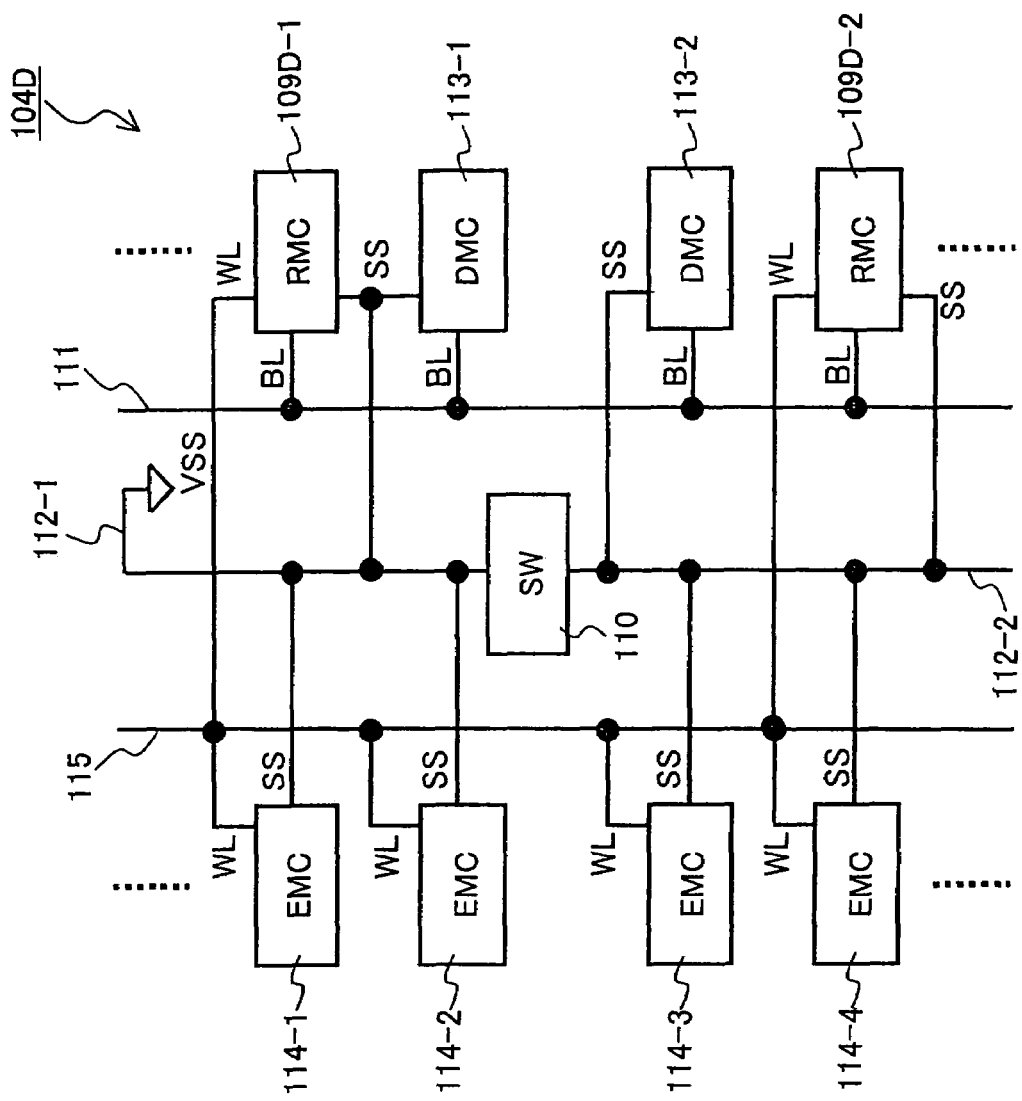
FIG. 4 is a functional block diagram showing an exemplary configuration of a replica circuit 104D in a semiconductor memory device according to Embodiment 4 of the present invention.

FIG. 4 is a functional block diagram showing an exemplary configuration of a replica circuit in a semiconductor memory device according to Embodiment 4 of the present invention. In FIG. 4, a replica circuit 104D of the present embodiment includes replica cells 109D-1 and 109D-2 (hereinafter, which may be referred to collectively as 109D), a switching circuit 110, dummy cells (DMC) 113-1 and 113-2 (hereinafter, which may be referred to collectively as 113) that are not driven by a dummy bit line 115, and edge cells (EMC) 114-1, 114-2, 114-3, and 114-4 (hereinafter, which may be referred to collectively as 114) that are not driven by the dummy bit line 115.

FIGS. 5A, 5B, 5C, and 5D are respectively circuit diagrams showing internal configurations of the memory cell 106, the replica cell 109D (having the same configuration as that of the replica cell 109A shown in FIG. 1), the dummy cell 113, and the edge cell 114. Herein, the transistors constituting the replica cell 109D (109A shown in FIG. 1), the dummy cell 113, and the edge cell 114 have the same size as that of the transistors constituting the memory cell 106.

Figure 5A:
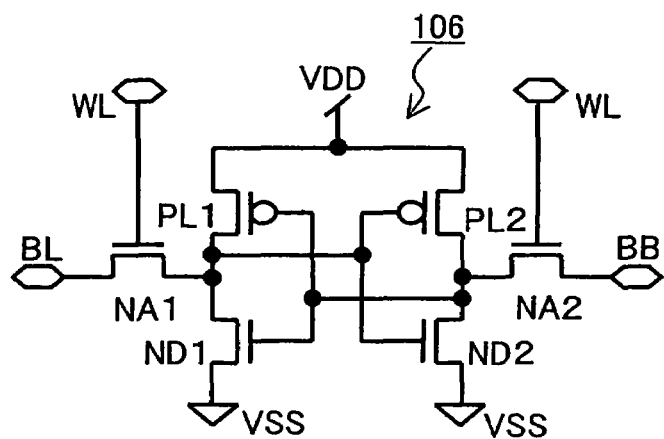
FIG. 5A is a circuit diagram showing an internal configuration of a memory cell 106 shown in FIG. 1.
Figure 12:
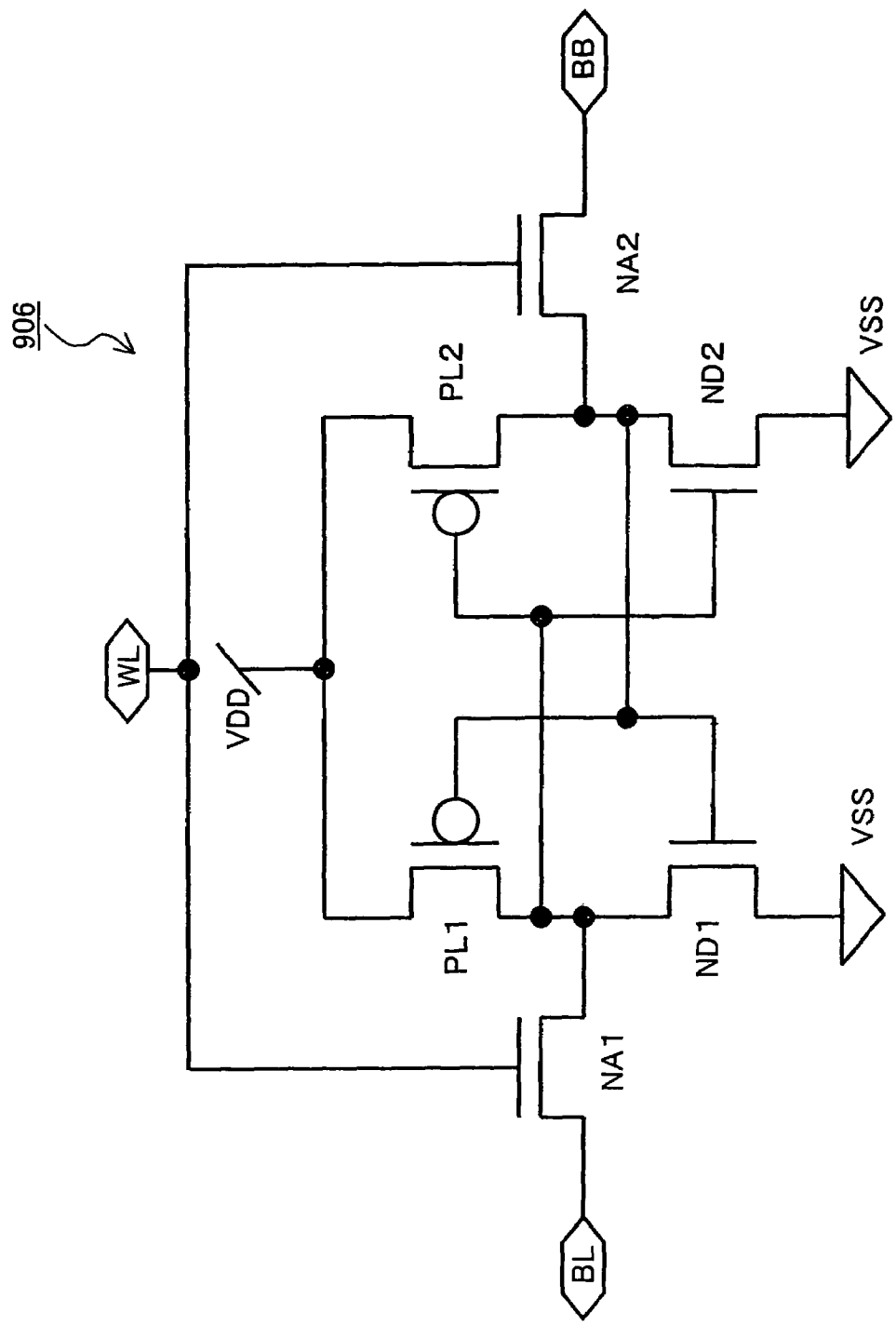
FIG. 12 is a circuit diagram showing an internal configuration of the memory cell 906 shown in FIG. 11.
Figure 13:
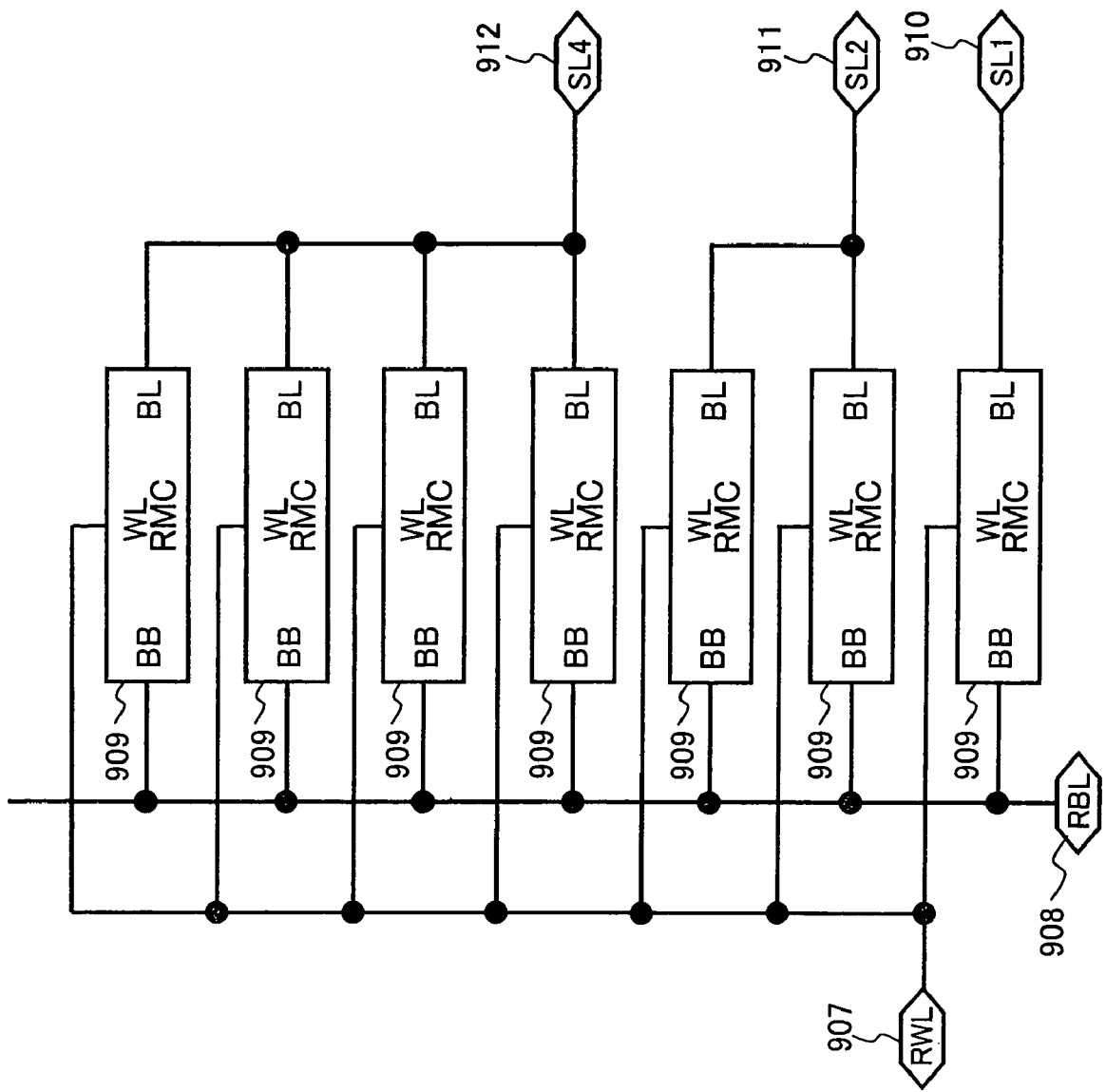
FIG. 13 is a block diagram showing an internal configuration of a replica circuit 904 shown in FIG. 11.
Figure 14:
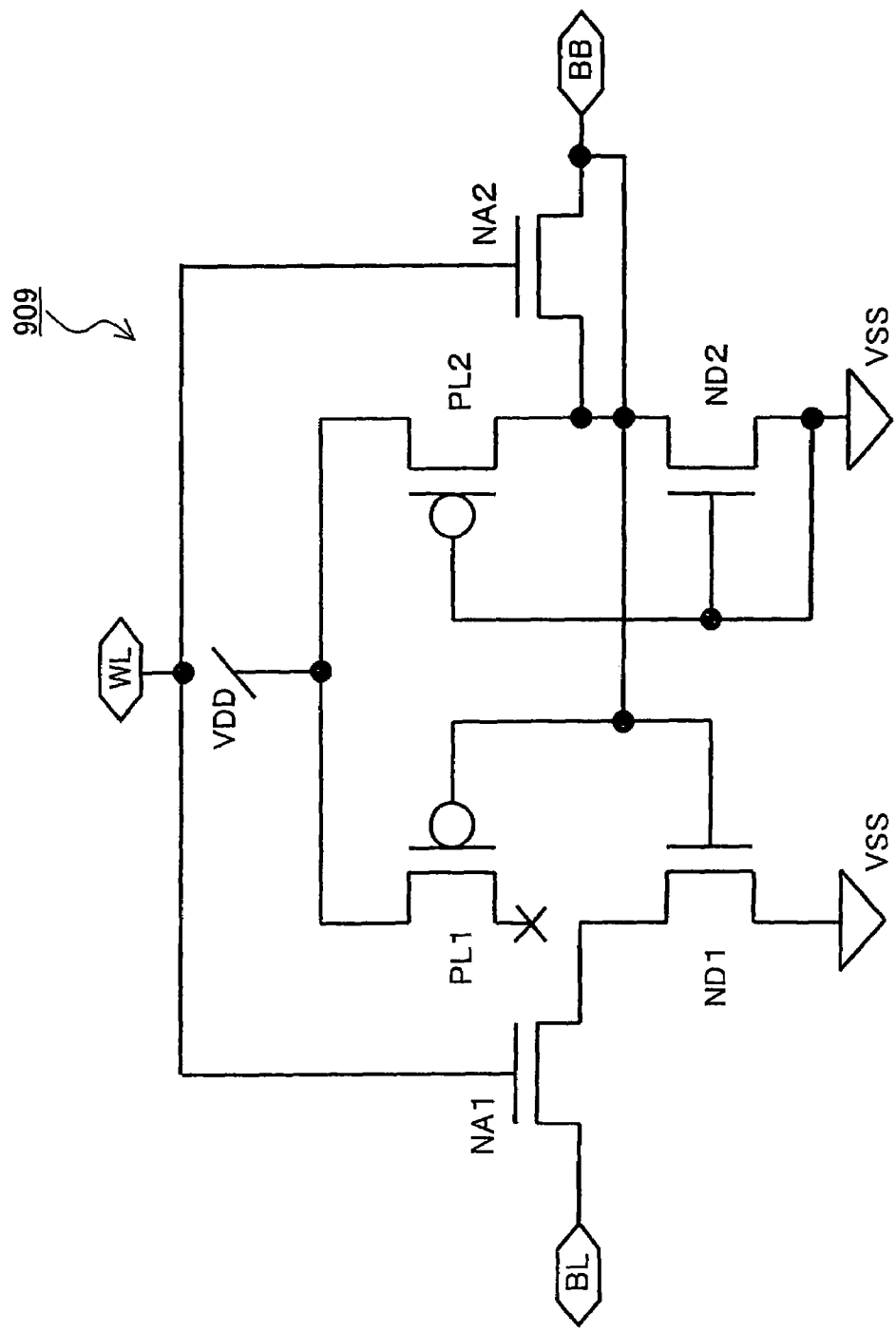
FIG. 14 is a circuit diagram showing an internal configuration of the replica cell 909 shown in FIG. 13.

The internal configuration of the memory cell 106 shown in FIG. 5A is the same as that of the memory cell 906 shown in FIG. 12.

Figure 5B:
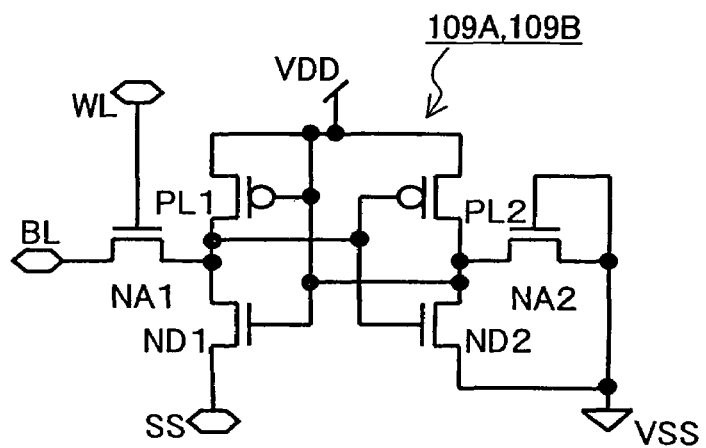
FIG. 5B is a circuit diagram showing an internal configuration of a replica cell 109 shown in FIGS. 1 to 4.

As shown in FIG. 5B, in the replica cell (RMC) 109D (109A in FIG. 1), a word line (WL) that is a gate line of an N-type transistor NA1 is connected to the dummy bit line 115, and a bit line (BL) that is a source line of the N-type transistor NA1 is connected to a replica bit line 111. Furthermore, a gate line and a source line of the N-type transistor NA2 are fixed to a ground potential VSS. Gate lines of a P-type transistor PL1 and an N-type transistor ND1 are fixed to a supply voltage VDD, and a source line (SS) of the N-type transistor ND1 is connected to a power line 112-1 or 112-2.

Figure 5C:
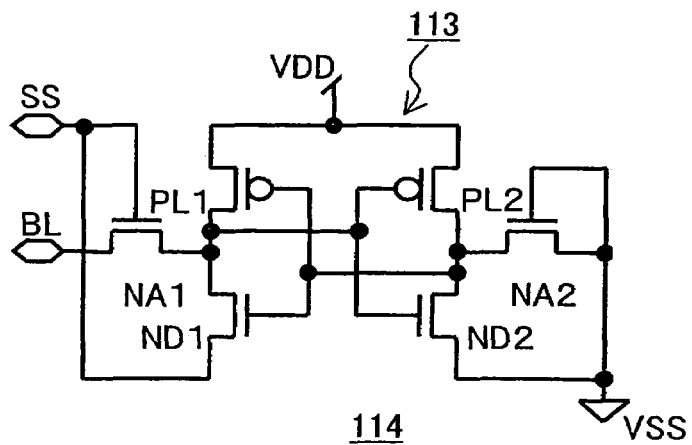
FIG. 5C is a circuit diagram showing an internal configuration of a dummy cell 113 shown in FIG. 4.

As shown in FIG. 5C, in the dummy cell (DMC) 113, a gate line of an N-type transistor NA1 is connected to the power line 112-1 or 112-2 commonly with the source line (SS) of the N-type transistor ND1. A bit line (BL) that is a source line of the N-type transistor ND1 is connected to the replica bit line 111.

Figure 5D:
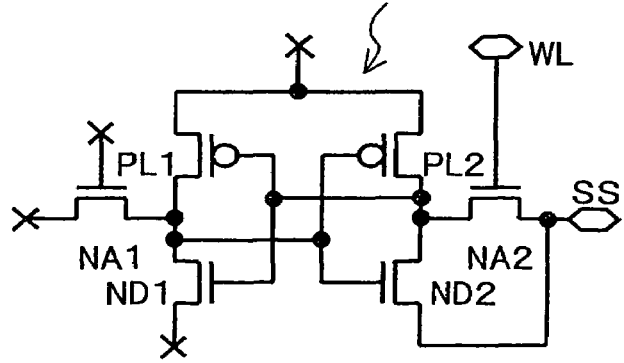
FIG. 5D is a circuit diagram showing an internal configuration of an edge cell 114 shown in FIG. 4.

As shown in FIG. 5D, in the edge cell (EMC) 114, a gate line and a source line of an N-type transistor NA1, a source line of P-type transistors PL1, PL2, and a source line of an N-type transistor ND1 are electrically insulated. Furthermore, a word line (WL) that is a gate line of an N-type transistor NA2 is connected to the dummy bit line 115, and a source line thereof is connected to the power line 112-1 or 112-2 commonly with the source line (SS) of the N-type transistor ND2.

Figure 6:
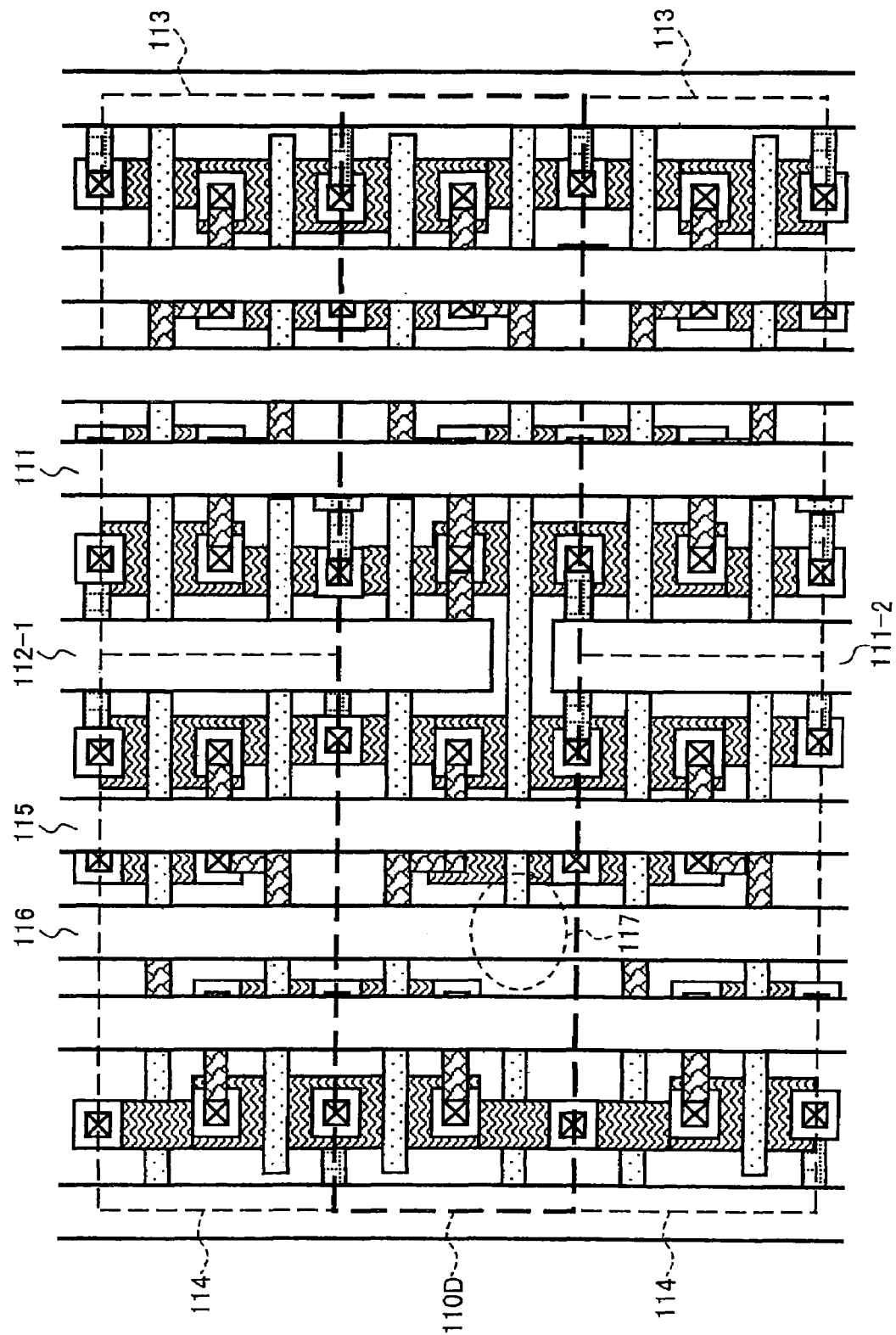
FIG. 6 is a plan view partially showing a layout of a replica circuit 104D shown in FIG. 4.

FIG. 6 is a plan view partially showing a layout of the replica circuit 104D shown in FIG. 4. In FIG. 6, the same components as those in FIG. 4 are denoted with the same reference numerals as those therein. Regarding the switching circuit, D is added to reference numeral 110 (i.e., 110D), whereby the switching circuit shown in FIG. 6 is distinguished from those in the other embodiments.

The dummy cells 113 are adjacent to the edge cells 114, and among a plurality of replica cells 109D, unused ones are used as the dummy cells 113.

The dummy bit line 115 is formed by using a layout of a bit line on a memory array side of the edge cells 114. The switching circuit 110D and its switching control line 116 are connected to each other via a contact 117 surrounded by a broken circle.

In the present embodiment, the switching control line 116 of the switching circuit 110D is formed by using a layout of a power line of the unused edge cells 114, and a drive transistor present in the memory cell 106 is used as it is for the switching circuit 110D. Because of this, a layout area is not increased. Thus, the practical effect is remarkable.

Furthermore, the layout of the switching circuit 110D is optically substantially the same as that of the peripheral dummy cell 113 and edge cell 114. This can enhance the production yield of a semiconductor memory device. Thus, the practical effect is remarkable.

Furthermore, by placing the dummy cells 113 between the switching circuit 110D and the replica cells 109D, the influence on the replica cells 109D due to the insertion of the switching circuit 110D can be minimized. Thus, the practical effect is remarkable.

Embodiment 5

Figure 7:
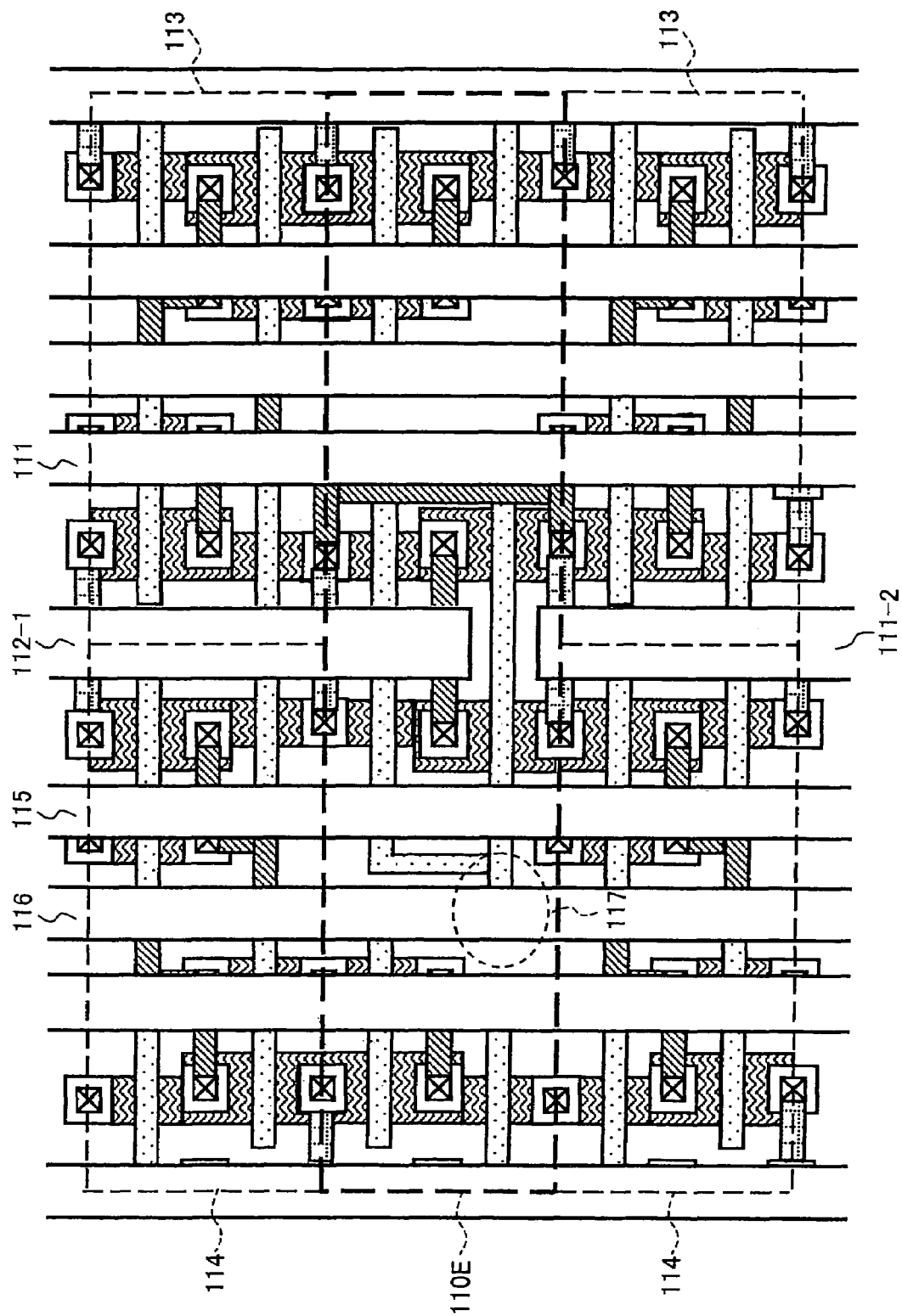
FIG. 7 is a plan view partially showing a layout of a replica circuit in a semiconductor memory device according to Embodiment 5 of the present invention.

FIG. 7 is a plan view partially showing a layout of a replica circuit in a semiconductor memory device according to Embodiment 5 of the present invention. The replica circuit in the present embodiment has the same block configuration as that of the replica circuit 104D in Embodiment 4 shown in FIG. 4. However, the replica circuit in the present embodiment is different from that in Embodiment 4 shown in FIG. 4 in a layout configuration of the switching circuit 110. In FIG. 7, the same components as those in FIG. 4 are denoted with the same reference numerals as those therein. Regarding the switching circuit, E is added to reference numeral 110 (i.e., 110E), whereby the switching circuit shown in FIG. 7 is distinguished from those in the other embodiments.

Referring to FIG. 7, in the present embodiment, drive transistors and access transistors present in the memory cell 106, connected in parallel to each other, are used as the switching circuit 110E. The other configuration is the same as that shown in FIG. 4.

As described above, according to the present embodiment, a diffusion layer region of the switching circuit 110E has a layout that is optically the same as that of the peripheral dummy cells 113 and edge cells 114. Furthermore, the size of the transistors constituting the switching circuit is larger than that in Embodiment 2. Therefore, more replica cells can be provided as options, compared with Embodiment 2. Furthermore, a layout area is not increased. Thus, the practical effect is remarkable.

Embodiment 6

Figure 8:
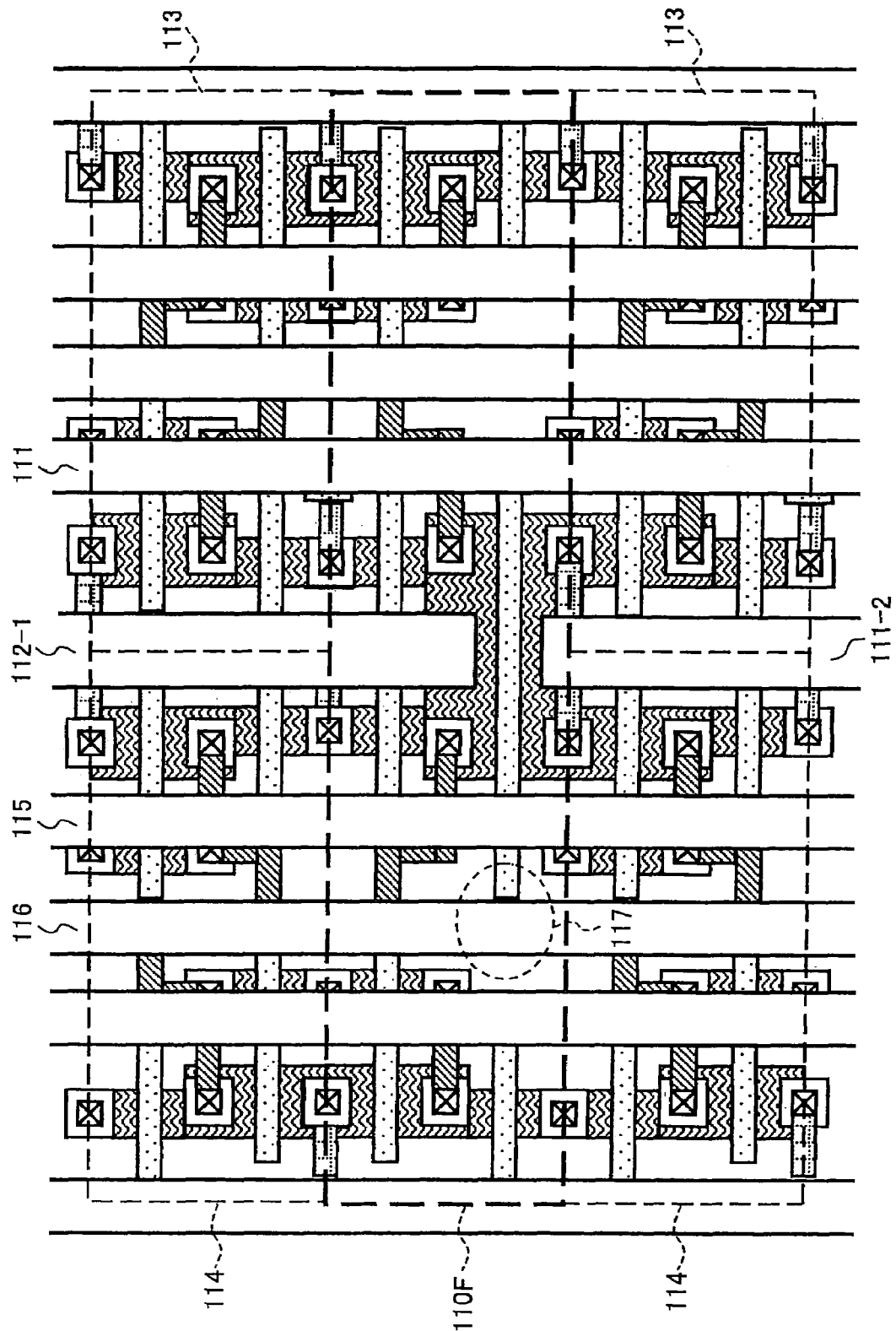
FIG. 8 is a plan view partially showing a layout of a replica circuit in a semiconductor memory device according to Embodiment 6 of the present invention.

FIG. 8 is a plan view partially showing a layout of a replica circuit in a semiconductor memory device according to Embodiment 6 of the present invention. The replica circuit in the present embodiment has the same block configuration as that of the replica circuit 104D in Embodiment 4 shown in FIG. 4. The replica circuit in the present embodiment is different from that in Embodiment 4 shown in FIG. 4 in a layout configuration of the switching circuit 110. In FIG. 8, the same components as those shown in FIG. 4 are denoted with the same reference numerals as those therein. Regarding the switching circuit, F is added to reference numeral 110 (i.e., 110F), whereby the switching circuit shown in FIG. 8 is distinguished from those in the other embodiments.

Referring to FIG. 8, in the present embodiment, drive transistors present in the memory cell 106 connected to a diffusion layer region of the transistors constituting the edge cells 114 are used as the switching circuit 110F. The other configuration is the same as that shown in FIG. 6.

As described above, according to the present embodiment, the diffusion layer region of the switching circuit 110F is varied. The size of the transistors constituting the switching circuit 110F is larger than that in Embodiments 4 and 5. Therefore, more replica cells can be provided as options, compared with Embodiments 4 and 5. Furthermore, a layout area is not increased. Thus, the practical effect is remarkable.

Embodiment 7

Figure 9:
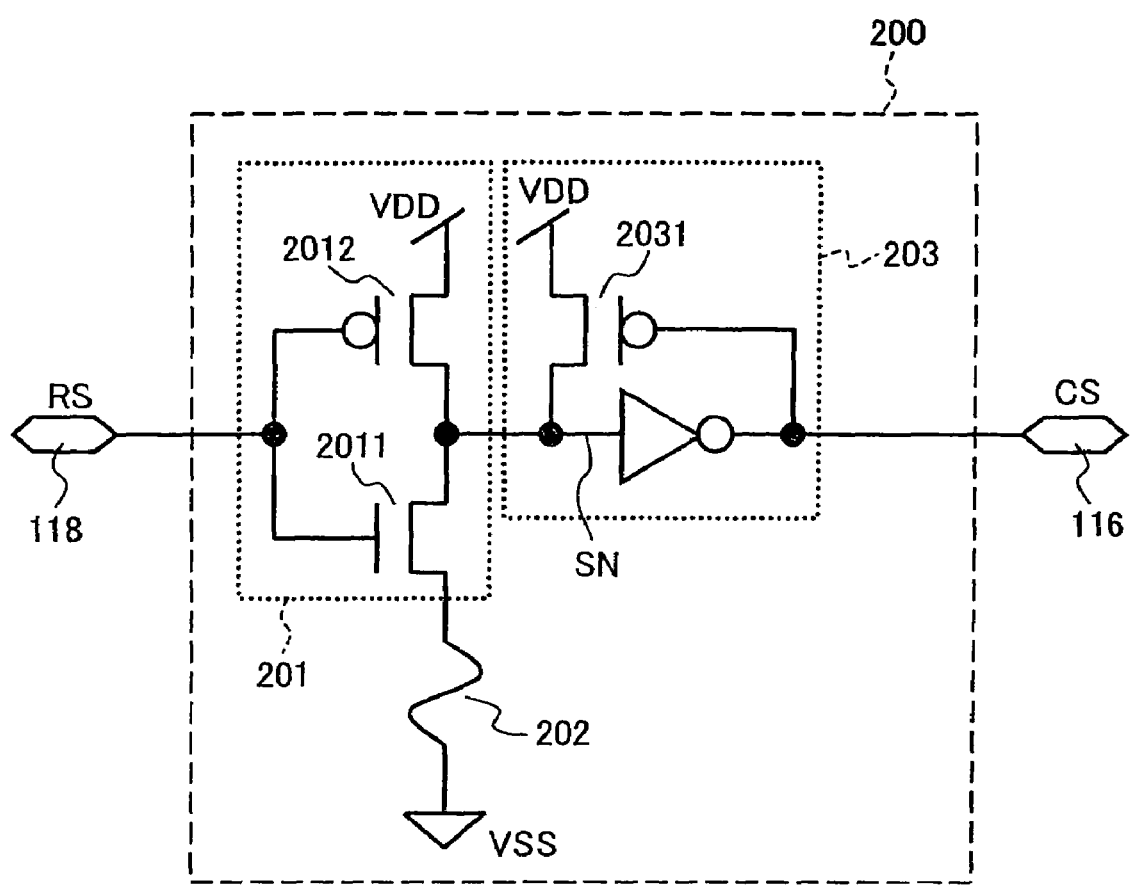
FIG. 9 is a circuit diagram showing an exemplary configuration of a selection circuit 200 for supplying a control signal CS, via a switching control line 116, to a switching circuit constituting a replica circuit in a semiconductor memory device according to Embodiment 7 of the present invention.

FIG. 9 is a circuit diagram showing an exemplary configuration of a selection circuit 200 that supplies a control signal CS to a switching circuit constituting a replica circuit in a semiconductor memory device via a switching control line 116 according to Embodiment 7 of the present invention. The selection circuit 200 in the present embodiment can be applied to Embodiments 1 to 6.

In FIG. 9, the selection circuit 200 includes an inverter 201 for receiving a reset signal RS from a reset signal line 118, a fuse element 202 connected to a source of an N-type transistor 2011 constituting the inverter 201, and a latch circuit 203 for holding a signal level at an output node SN of the inverter 201 and outputting it to the switching control line 116 as the control signal CS.

Next, an operation of the selection circuit 200 configured as described above will be described.

In the case where the fuse element 202 is not disconnected, when a pulse signal is input as the reset signal RS, an N-type transistor 2011 of the inverter 201 is turned off, a P-type transistor 2012 thereof is turned on, and an output node SN of the inverter 201 is turned to be a High level while the reset signal RS is at a Low level. Because of this, a P-type transistor 2031 of the latch circuit 203 is turned on, and the latch circuit 203 temporarily latches a High level of the output node SN of the inverter 201, and outputs a Low level to the switching control line 116 as the control signal CS.

Next, when the reset signal RS is shifted from a Low level to a High level, the N-type transistor 2011 of the inverter 201 is turned on, the P-type transistor 2012 thereof is turned off, and the output node SN of the inverter 201 is turned to be a Low level. Because of this, the P-type transistor 2031 of the latch circuit 203 is turned off. Consequently, the signal level held by the latch circuit 203 is cancelled, and a High level is output to the switching control line 116 as the control signal CS.

On the other hand, in the case where the fuse element 202 is disconnected, when a pulse signal is input as the reset signal RS, the latch circuit 203 latches a High level of the output node SN of the inverter 201, and outputs a Low level to the switching control line 116 as the control signal CS while the reset signal RS is at a Low level.

Next, even if the reset signal RS is shifted from a Low level to a High level, the output node SN of the inverter 201 is not connected to the ground potential VSS. Therefore, the latch circuit 203 holds the High level at the output node SN of the inverter 201, and the Low level output to the switching control line 116 as the control signal CS is maintained.

Because of this, the replica cells to be activated can be determined depending upon whether or not the fuse element 202 is disconnected.

As described above, according to the present embodiment, even if the timing generated by the replica circuit is shifted from a desired signal due to a defect of the replica cell, an optimum timing can be selected. Thus, the practical effect is remarkable.

Embodiment 8

Figure 10:
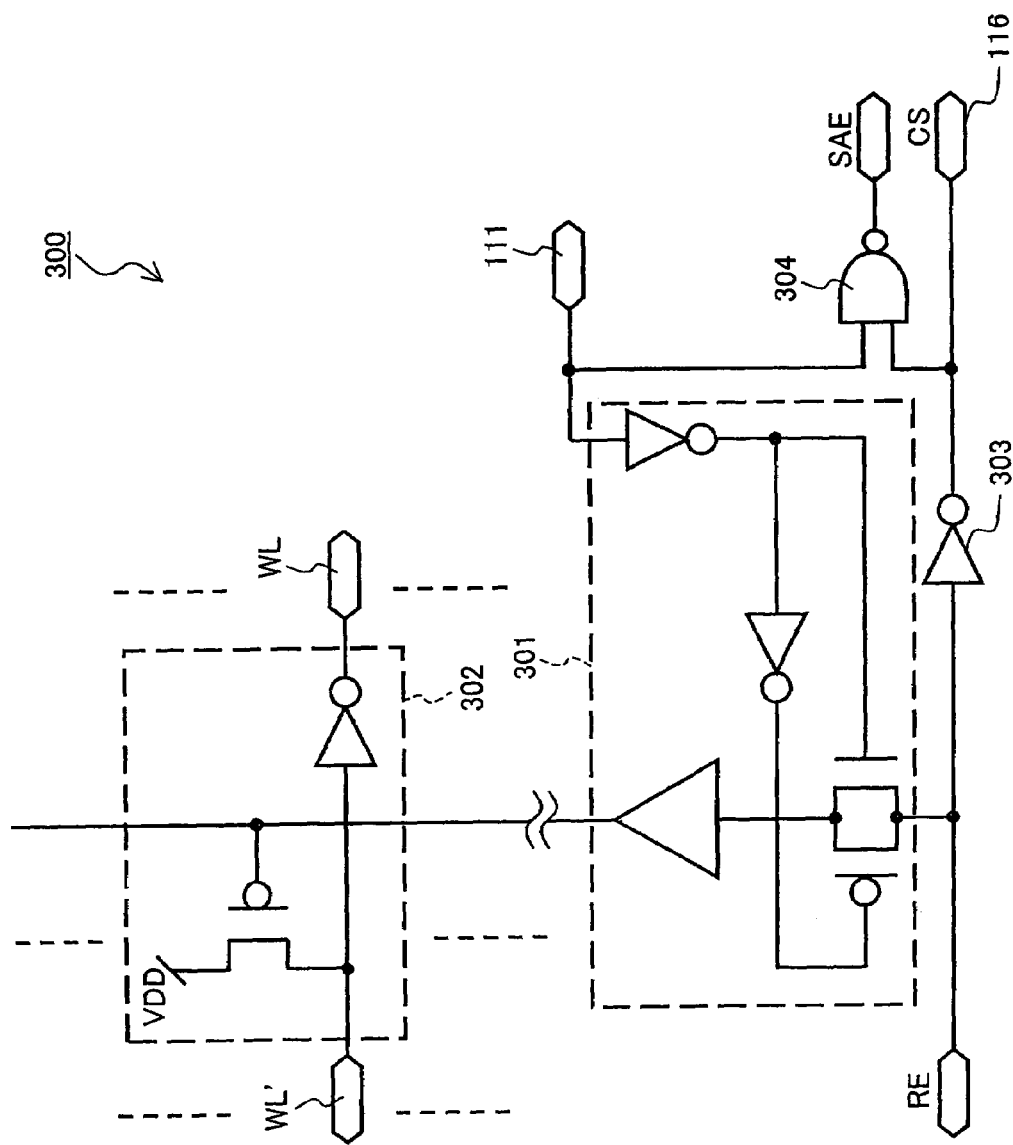
FIG. 10 is a circuit diagram showing an exemplary configuration of a control circuit 300 having a function as a selection circuit for supplying a control signal CS, via a switching control line 116, to a switching circuit constituting a replica circuit in a semiconductor memory device according to Embodiment 8 of the present invention, and a function as a sense amplifier control circuit 105 shown in FIG. 1.
Figure 11:
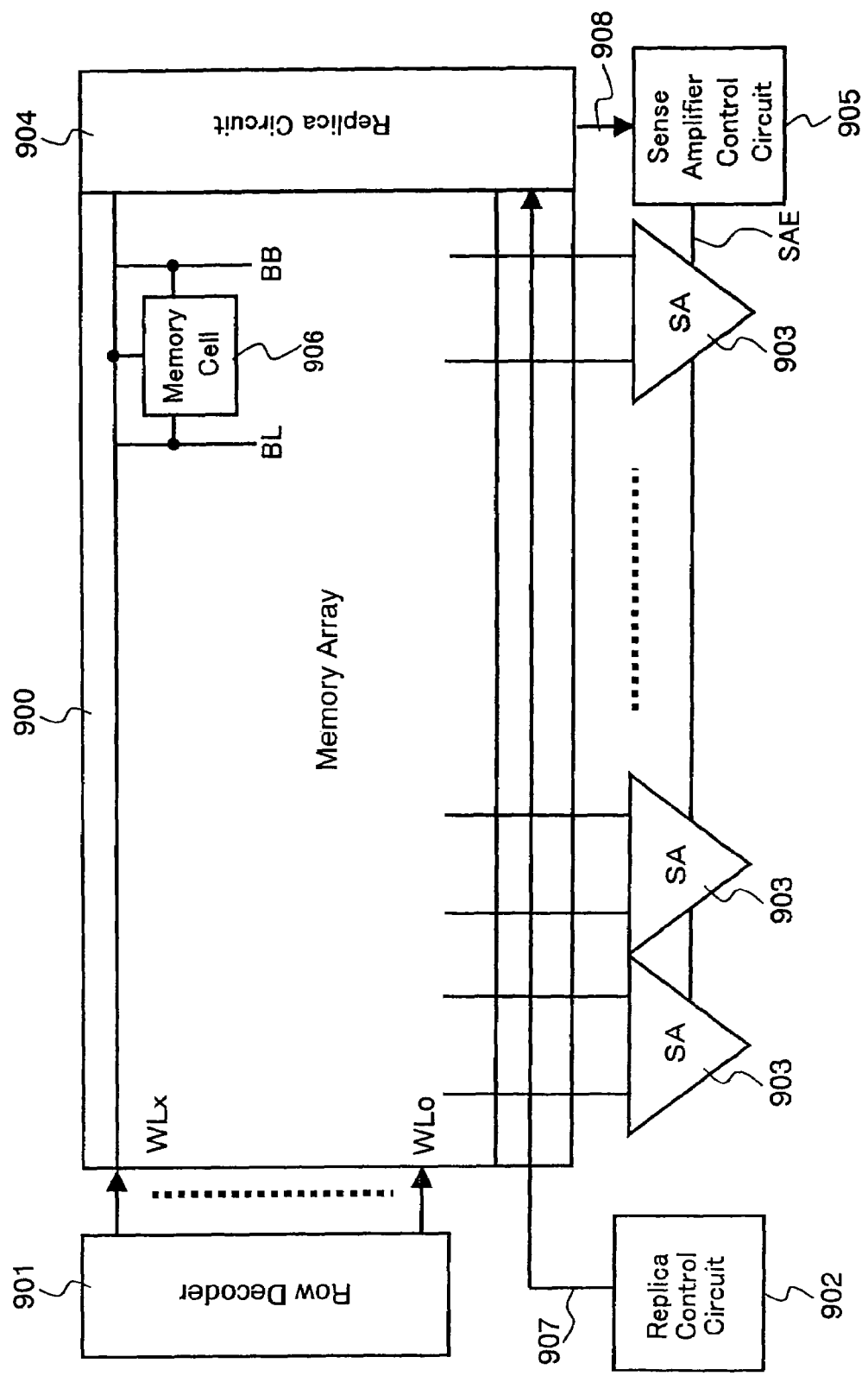
FIG. 11 is a functional block diagram showing an exemplary configuration of a conventional semiconductor memory device.

FIG. 10 is a circuit diagram showing an exemplary configuration of a control circuit 300 having a function as a selection circuit that supplies a control signal CS to a switching circuit constituting a replica circuit via a switching control line 116 in a semiconductor memory device according to Embodiment 8 of the present invention, and a function as the sense amplifier control circuit 105 shown in FIG. 1. The control circuit 300 in the present embodiment can be applied to Embodiments 1 to 6.

In FIG. 10, the control circuit 300 includes a transfer gate 301, a plurality of word line pull-down circuits 302, an inverter 303, and a NAND circuit 304.

The transfer gate 301 is controlled with a signal of a replica bit line 111, and transmits or interrupts a read enable signal RE. The plurality of word line pull-down circuits 302 are placed between the row decoder 101 and the memory array 100, and have a function of receiving the read enable signal RE from the transfer gate 301 to decrease a word line WL to a Low level increase a word line WL' to a High level). The inverter 303 receives the read enable signal RE, and outputs its inverted signal to the switching control line 116 as a control signal CS. The NAND circuit 304 receives a signal of the replica bit line 111 and the control signal CS, and supplies a sense amplifier starting signal SAE to the sense amplifier circuit 103.

Next, an operation of the control circuit configured as described above will be described.

When the read enable signal RE is activated to be a High level during read operation, the control signal CS is turned to be a Low level, and the switching circuit 110 is turned off. Next, when the memory array 100 is accessed and a signal from the replica bit line 111 reaches a level in accordance with the stage number of the replica cells, a Low level that is an inverted signal of the read enable signal RE is sent to the sense amplifier 103 as the sense amplifier starting signal SAE via the NAND 304. At this time, the transfer gate 301 interrupts the read enable signal RE, so that the word line pull-down circuit 302 is not operated.

Furthermore, when the read enable signal RE is deactivated to be a Low level during write operation, the control signal CS is turned to be a High level, and the switching circuit 110 is turned on. When the memory array 100 is accessed and a signal from the replica bit line 111 reaches a level in accordance with the stage number of the replica cells, the transfer gate 301 is brought into conduction, and the word line pull-down circuit 302 is operated to decrease the selected word line WL to a Low level.

When a word line WL is selected for a long period of time, and the potential difference between the bit lines BL and BB is increased more than necessary during read operation, a current consumption is increased due to the later precharging. Furthermore, even in the case where a write operation is continued after the data of the memory cell 106 is rewritten during write operation, a current consumption is increased. Furthermore, in general, the read time of data is different from the write time of data.

However, by optimizing the timing during read operation and write operation, using the control circuit in the present embodiment, wasted current consumption can be suppressed. Thus, the practical effect is remarkable.

As described above, according to the present invention, by varying the stage number of the replica cells in a programmable manner, a semiconductor memory device can be provided, which is capable of supplying an optimum start timing to a sense amplifier circuit without increasing a layout area.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device, comprising:
   a memory array including a plurality of memory cells;
   a sense amplifier circuit for amplifying data read from
      selected memory cells in the memory array to bit lines;

a replica circuit including a plurality of replica cells having the same elements as those of the memory cells that outputs a signal at a level in accordance with a stage number to a common replica bit line; and a sense amplifier control circuit for receiving the signal of the replica bit line to control a timing of a signal for starting the sense amplifier circuit, wherein the replica circuit includes a switching circuit for switching the stage number of replica cells to be activated among the plurality of replica cells.

2. The semiconductor memory device according to claim 1, wherein the switching circuit switches a connection state of a power line to the plurality of replica cells, thereby switching the stage number of replica cells to be activated.

3. The semiconductor memory device according to claim 1, wherein the replica circuit comprises a plurality of switching circuits on one power line.

4. The semiconductor memory device according to claim 1, wherein the replica circuit comprises switching circuits on a plurality of power lines.

5. The semiconductor memory device according to claim 1, wherein the replica circuit comprises dummy cells having the same layout as that of the replica cells and disposed between the switching circuit and the replica cells.

6. The semiconductor memory device according to claim 5, wherein the switching circuit is configured using transistors constituting the dummy cells.

7. The semiconductor memory device according to claim 5, wherein the switching circuit is configured by connecting the transistors constituting the dummy cells in parallel to each other.

8. The semiconductor memory device according to claim 5, wherein the switching circuit is configured using transistors in a region of edge cells adjacent to a region of the dummy cells.

9. The semiconductor memory device according to claim 5, wherein the switching circuit is configured by connecting transistors in a region of the dummy cells in parallel with transistors in a region of the edge cells adjacent to the region of the dummy cells.

10. The semiconductor memory device according to claim 1, wherein a switching control line of the switching circuit is formed using a layout of power lines or bit lines of the adjacent edge cells.

11. The semiconductor memory device according to claim 1, comprising a selection circuit for supplying a control signal to the switching circuit via a switching control line, the selection circuit comprising a storage unit for holding a level of the control signal.

12. The semiconductor memory device according to claim 11, wherein the storage unit is a non-volatile memory unit.

13. The semiconductor memory device according to claim 12, wherein the non-volatile memory unit comprises a fuse element capable of being disconnected by a laser.

14. The semiconductor memory device according to claim 1, comprising a control circuit for supplying a control signal with a level varied between a read operation and a write operation to the switching circuit via a switching control line.

* * * * *